United States Patent [19]

Ikubo et al.

[11] Patent Number: 5,734,458
[45] Date of Patent: Mar. 31, 1998

[54] DISPLAY APPARATUS WITH DRIVE CIRCUITS ON THE SUBSTRATE AND WITH A SHORTING LINE

[75] Inventors: Katsumasa Ikubo, Tenri; Yasunori Shimada, Kashihara, both of Japan

[73] Assignee: Sharp Kabushiki Kaisha, Osaka, Japan

[21] Appl. No.: 288,906

[22] Filed: Aug. 11, 1994

[30] Foreign Application Priority Data

Aug. 12, 1993 [JP] Japan ................... 5-200765

[51] Int. Cl.⁶ ............ G02F 1/1345; H01L 23/48; H01L 23/52
[52] U.S. Cl. ............ 349/149; 349/152; 257/692
[58] Field of Search ............ 359/55, 88, 59, 359/82, 87; 349/42, 149, 152; 257/692, 693, 776

[56] References Cited

U.S. PATENT DOCUMENTS

| | | | |
|---|---|---|---|
| 4,120,041 | 10/1978 | Hayakawa et al. | 361/681 |
| 4,666,254 | 5/1987 | Itoh et al. | 359/88 |
| 4,752,118 | 6/1988 | Johnson | 359/88 |
| 4,917,466 | 4/1990 | Nakamura et al. | 359/88 |
| 4,985,663 | 1/1991 | Nakatani | 359/88 |
| 5,029,984 | 7/1991 | Adachi et al. | 359/88 |
| 5,056,895 | 10/1991 | Kahn | 359/84 |
| 5,200,847 | 4/1993 | Mawatari et al. | 359/82 |
| 5,276,541 | 1/1994 | Terada et al. | 349/153 |
| 5,286,659 | 2/1994 | Mitani et al. | 437/21 |
| 5,341,233 | 8/1994 | Tomoike et al. | 359/88 |
| 5,467,210 | 11/1995 | Kishigami | 359/88 |

FOREIGN PATENT DOCUMENTS

| | | | |
|---|---|---|---|
| 61-137134 | 6/1986 | Japan | 359/82 |
| 1-055525 | 3/1989 | Japan | 359/82 |
| 2-242229 | 9/1990 | Japan | 359/55 |
| 4-283727 | 10/1992 | Japan | . |
| 6-88971 | 3/1994 | Japan | . |
| 6-130374 | 5/1994 | Japan | 359/59 |

OTHER PUBLICATIONS

Webster's II New Riverside University Dictionary, 1988 Edition, p. 264.

*Primary Examiner*—William L. Sikes
*Assistant Examiner*—Walter Malinowski
*Attorney, Agent, or Firm*—Nixon & Vanderhye

[57] ABSTRACT

A display apparatus having high reliability of display which can be manufactured at a low cost with high yield of production by simplified processes, of mounting drive circuits, wherein input terminals for the display signals and shorting members can be easily connected; a plurality of drive circuits which drive a display section are formed on a non-single crystal insulator substrate and mounted on a substrate via an anisotropic conductor film; and through-holes of the data lines or the scan lines and through-holes of the signal lines for the input of image signals from an external circuit are arranged parallel to the direction of arrangement of the drive circuit. This arrangement makes it possible to connect the data line and the scan line to a short ring, which is provided at an end of the substrate, without the wiring strips crossing each other.

11 Claims, 6 Drawing Sheets

DISPLAY APPARATUS WITH DRIVE CIRCUITS ON THE SUBSTRATE AND WITH A SHORTING LINE

BACKGROUND OF THE INVENTION

1. Field of the Invention

The present invention relates to a display apparatus wherein a plurality of drive circuits realized by including TFT (thin film transistor) and other elements are connected to a display panel having a plurality of pixels arranged in a matrix configuration.

2. Description of the Related Art

FIG. 5 is a drawing illustrative of an example of equivalent circuit of a display apparatus 50. The display apparatus 50 includes a liquid crystal display section 51 and drive circuits 52, 53 on the data and scan sides. In the liquid crystal display section 51, a plurality of data signal lines D1 through D6 are wired in parallel to each other and a plurality of scan signal lines S1 through S3 are wired at right angles to the data signal lines D1 through D6, wherein a rectangular region formed by the intersecting signal lines acts as a pixel 58 to carry out display. The pixel 98 is provided with a TFT element 59, a pixel electrode 60 and an auxiliary capacitive element 61 installed therein. The TFT element 59 is a switching element which supplies the pixel electrode 60 with a display signal received from the drive circuits 52, 53. Incident light is either transmitted or intercepted depending on whether or not to apply a specified voltage for driving the liquid crystal between the pixel electrode 60 and a common electrode which opposes the pixel electrode 60 and which is connected to a common electrode line C. Matrix display is carried out by controlling the light transmit/intercept status of a plurality of pixels.

The auxiliary capacitive element 61 compensates for electric charges discharged from the pixel electrode 60 when the voltage is applied, and thereby stabilizes the display. The auxiliary capacitive element 61 is formed by using, for example, the scan signal lines S1 through S3 and the pixel electrode 60.

The data side drive circuit 52 includes a shift register 54, transfer gates 55 and sample-hold capacitive elements 56. A plurality of transfer gates 55 and the sample-hold capacitive elements 56 are installed individually corresponding to a plurality of the data signal lines D1 through D6. A display signal R which is input to the data drive circuit 52 is supplied to each of the transfer gates 55. The display signals R input to the transfer gates 55 are all supplied to the sample-hold capacitive elements 56 at the same time under the control of the shift register 54. From the sample-hold capacitive elements 56, the display signals R are fed to the data signal lines D1 through D6. The data drive circuit 52 is supplied with power voltage V1 to drive the circuit 52. The power voltage V1 and the display signals R are supplied from an external circuit.

The scan side drive circuit 53 includes a shift register 57, and is supplied with power voltage V2 to drive the scan side drive circuit 53. One of the plurality of scan signal lines S1 through S3 is selected by the control of the shift register 57. The power voltage V2 is supplied from an external circuit.

In the display apparatus 50, a shorting member (referred to as) short ring is provided for the protection against static electricity generated during manufacturing processes or as the test signal input terminal for the test of display state. In such a case as described above, plurality of the data signal lines D1 through D8 and the scan signal lines S1 through S3 are short-circuited by means of the respective short rings on the side opposite to that where the signal lines are connected to the drive circuits 52, 53.

When numbers of the data signal lines D1 through D6 and the scan signal lines S1 through S3 increase as the resolution of display increases or the display size increases, the data signal lines D1 through D6 are divided into two groups and driven accordingly, and therefore, two data side drive circuits are provided. The two data side drive circuits 52 are installed on one side and the other side of the data signal lines D1 through D6, respectively. In such a case, the short rings must be installed on the side where the drive circuit is installed.

During the testing of the display state when the auxiliary capacitive elements 61 are provided as shown in the display apparatus 50, scan signals are input by introducing time lags between the adjacent scan signal lines S1 through S3. This is because the adjacent scan signal lines S1 to S3 being at the same potential makes storage of electric charge impossible. For this reason, the adjacent scan signal lines S1 to S3 must be connected to different short rings, thereby making if necessary to provide at least two short rings with one of them being installed on the side of the drive circuit.

FIG. 6A, 6B are plan view drawings illustrative of the wiring between the drive circuits and the display panel in a display apparatus of the prior art. FIG. 6A shows a display apparatus 1 wherein the drive circuits 4 are connected by the TAB (Tape Automated Bonding) method. FIG. 6B shows a display apparatus 11 wherein drive circuits 14 are connected by the COG (Chip On Glass) method. As shown in FIG. 6A, the display apparatus 1 has the drive circuits 4 being mounted on a film substrate 3, while the film substrate 3 and a display section 2 are electrically connected. As shown in FIG. 6B, the display apparatus 11 has the drive circuits 14 which are directly mounted by the COG method on a substrate 13 comprising a display section 12, and which are electrically connected by means of an anisotropic conductor membrane or the like.

Also, in the field of display apparatuses based on an active matrix drive, a driver monolithic type display apparatus has been proposed wherein a display panel, drive circuits and interconnection terminals for the connection thereof are formed simultaneously on the same substrate. In such a display apparatus, switching elements comprised of TFT or the like are connected to pixels arranged in a matrix, thereby selectively driving the pixels.

In a display apparatus disclosed in Japanese Unexamined Patent Publication No. 4-283727, drive circuits and wiring strips are formed on a separate substrate other than a display panel substrate, while the substrate and the display panel substrate are electrically connected to each other.

While various methods of mounting peripheral circuits have been attempted, those of mounting the drive circuits by the TAB method or the COG method require plural drive circuits to be mounted on one display apparatus. Therefore, the process of mounting the drive circuits becomes complicated, thereby making it an obstacle to reducing the manufacturing cost of a display apparatus.

FIG. 7 is a plan view drawing illustrative of the interconnection between the TFT drive circuit 14 and the scan lines or data lines 16 mounted by the COG method shown in FIG. 6B. As shown in FIG. 7, the scan lines 16 or the data lines 16 extended out of the display section 12 are provided with through-holes 17 formed at the ends thereof. In the drive circuit 14, the scan lines 16 or the data lines 16 and output terminals of the drive circuit 14 which oppose the scan or data lines are electrically connected by means of an anisotropic conductive membrane or the like, via the through holes 17.

Because of the very small size of the drive circuit 14 which is made with the emphasis placed on the size reduction, the through holes 17 of the scan lines 16 or the data lines 16 and the output terminals of the drive circuit 14 are installed on both sides of the drive circuit 14. Also the drive circuit 14 is arranged such that the output terminals of the drive circuit 14 are arranged parallel to the scan lines 16 or the data lines 16, namely parallel to the direction indicated by arrow R in FIG. 6. On the substrate 13, output terminals 15 are formed for the output of video signals supplied from an external circuit not shown in the drawing. In the drive circuit 14, the output terminal 15 and an input terminal of the drive circuit 14 which oppose the output terminal are electrically connected by means of an anisotropic conductive membrane or the like, via through-holes 18 formed at the output terminals 15. Length of the output terminal of one drive circuit 14 in the direction parallel to the direction of arrangement is about 2 cm, for example, and the pitch of arranging the output terminals is from 0.5 to 1.0 mm. This means that about 16 to 30 output terminals are installed on one side. A plurality of such drive circuits 14 are installed.

In the drive circuit 14, video signals of serial information are input via the input terminal, and video signals of parallel information are output via the output terminals to the scan lines or the data lines 16. Thereby, the display section 12 is driven.

However, in a display apparatus having increased resolution of display and increased display size, or in a display apparatus provided with auxiliary capacitive elements, when the scan lines 16 or the data lines 16 are connected to both sides of the drive circuit 14 as shown in FIG. 7, the scan lines 16 or the data lines 16 cannot be connected to the short ring, not shown in the drawing, provided for the protection of the components elements formed on the display panel against static electricity generated during the manufacturing process or for the purpose of testings. That is, the short ring is installed at an end of the substrate 13 on the opposite side of the display panel, and an attempt to connect a plurality of scan lines 16 or the data lines 16 to the short ring causes the wires to contact each other.

The short ring is provided for the protection against static electricity or as the test signal input terminal, as described previously. In a display apparatus having switching elements such as TFT elements, insulation breakdown of elements due to accumulated static electricity leads to a display failure of the pixel having the damaged element. Use of TFT elements increases the manufacturing cost, and the yield of production decreases when a number of defective products are generated due to the static electricity. Therefore, it is necessary to install such short rings as described above.

In case the drive circuit 14 is made a large size and the output terminals are installed only on one side, the drive circuit 14 can be arranged so that the output terminals of the drive circuits 14 are arranged in a direction perpendicular to the direction indicated by the arrow R, thereby making it possible to connect the plurality of scan lines 16 or the data lines 16 to the short ring without the lead wires making contact with each other. However, because the drive circuit 14 has been fabricated with the aim at size reduction in the prior art, large-sized drive circuits 14 are not manufactured. To fabricate large-sized drive circuits 14 with a manufacturing apparatus designed for small-sized drive circuits 14, it is necessary to provide an additional facility to adapt to the manufacture of large-sized drive circuits, and therefore, it is difficult to manufacture by using the existing facilities.

In the substrate of driver monolithic type active matrix display apparatus wherein a display panel, drive circuits and interconnection wires thereof are formed simultaneously on the same substrate, there is an advantage that the mounting process is greatly simplified. However, because the drive circuits and the wiring are formed simultaneously with the switching elements such as the TFT elements in the display panel, an advanced micro-machining technology is required and therefore it is difficult to form the substrate with a high yield of production, when compared to such methods as TAB and COG wherein IC chips are simply connected. Specifically, while a defect in the drive circuit or in the display panel can be countered simply by replacing the defective part in the case of the TAB method and the COG method, such a replacement cannot be done in the case of the driver monolithic type which requires all parts to be discarded even when a defect is found in only either the drive circuit or the display panel.

Further in a display apparatus disclosed in Japanese Unexamined Patent Publication No. 4-283727, connection of the display panel and the peripheral circuits including the drive circuits and the wiring is carried out by first connecting the scan lines and the data lines of the display panel to a printed circuit board and then by connecting the peripheral circuits formed on a substrate, which is separate from the substrate where the display panel is formed, to the printed circuit board. Thus, connection failures are likely to occur during the process of mounting the drive circuit.

SUMMARY OF THE INVENTION

The object of the invention is to solve the problems described above and to provide a display apparatus having high reliability of display which can be manufactured at a low cost with high yield of production by using simplified processes of mounting the drive circuit wherein input terminals for the display signals and shorting members can be easily connected.

The invention provides a display apparatus comprising:
   a display panel having a plurality of pixels arranged in a matrix on an insulating substrate, a plurality of row and column wiring strips installed for the strings of the pixels in the directions of rows and columns thereof and a plurality of row and column terminals connected to the row and column wiring strips, the row and column terminals receiving input display signals to selectively drive the pixels; and
   drive circuits on the row and column sides having a plurality of output terminals installed on the periphery of the insulating substrate individually connected to the row and column terminals, the drive circuits outputting the display signals from the output terminals at a specified timing, wherein
   the direction of arrangement of the row terminals of the display panel is chosen to cross the strings of the pixels ,connected to the row terminals, while the direction of arrangement of the column terminals of the display sections is chosen to cross the strings of pixels connected to the column terminals, and
   the directions of arrangement of the output terminals of the row and column side drive circuits are chosen in a manner similar to the directions of arrangement of the row and column terminals of the display panel, respectively.

The invention also provides a display apparatus, comprising;

an insulating substrate;

a display section having a plurality of pixels formed on the insulating substrate and arranged in a matrix, a plurality of row and column wiring strips installed for the strings of the pixels in the directions of the rows and columns thereof and a plurality of row and column terminals connected to the row and column wiring strips, respectively, the row and column terminals receiving the input of display signals to selectively drive the pixels;

a plurality of output terminals formed on the insulating substrate output display signals which are supplied from an external circuit; and row and column side drive circuits having a plurality of first and second terminals connected individually to the row or column terminals and the output terminals, the drive circuits outputting the display signals which are input to the second terminals from the first terminals at a specified timing, wherein the row and column side drive circuits are formed on an insulating substrate made of non-single crystal material which is different from the insulating substrate, respectively, and are arranged in the circumference of the display section on the insulating substrate;

the direction of arrangement of the row terminals of the display section is chosen to cross the strings of the pixels connected to the row terminals, while the direction of arrangement of the column terminals is chosen to cross the strings of the pixels connected to the column terminals, and the directions of arrangement of the first terminals of the row and column side drive circuits are chosen in a manner similar to the directions of arrangement of the row and column terminals of the display section, respectively.

The invention also includes;

a plurality of conducting layers connected to the plurality of row and column terminals and mounted on the insulating substrate in such a manner as to be directed toward the periphery of the insulating substrate; and a shorting line installed along the periphery of the insulating substrate, connecting the conducting layers collectively.

According to the present invention, display signals are output at a specified timing from the output terminals of the drive circuits on the row and column sides of a plurality of pixels which are arranged in matrix. The display signals are supplied to a plurality of row and column terminals, respectively connected to a plurality of row and column wiring strips installed for strings of the pixels in the row and column directions. The pixels are selectively driven according to the display signals.

Direction of arrangement of the row terminals is chosen to cross the strings of pixels which are connected to the row terminals. Direction of arrangement of the column terminals is chosen to cross the strings of pixels which are connected to the column terminals. That is, the row terminals are not installed parallel to the strings of pixels connected to the row terminals. The same applies also to the column terminals. Directions of arrangement of the output terminals of the row and column side drive circuits are chosen similarly to the directions of arrangement of the row and column terminals. Installing the terminals in such an arrangement makes it possible to easily install the conducting layers connecting to shorting line.

This means that, preferably, the conducting layers connected to the row and column terminals are installed on the insulating substrate where the pixels are installed in such a manner as being directed toward the periphery of the insulating substrate, and are collectively connected by a shorting line installed along the periphery of the insulating substrate. Because the row and column terminals are arranged in a manner described above, the conducting layers can be installed so as to be directed toward the periphery of the insulating substrate without crossing each other. The shorting line connecting such conducting layers is used to protect the display apparatus from static electricity generated during manufacturing, or as an input terminal for the test signal for testing the display state.

Also according to the present invention, the insulating substrate is provided thereon with a display section having pixels, row and column wiring strips and row and column terminals, a plurality of output terminals to output the display signals which are supplied from an external circuit, and row and column side drive circuits as described above having the first and the second terminals which are individually connected to the row or column terminals and output terminals. For example, display signals from the external circuit which are supplied to the second terminal of the row side drive circuit are supplied to the row terminals connected to the first terminals at a specified timing. The same applies to the column side, and the pixels are selectively driven according to the display signals.

Direction of arrangement of the row and column terminals is chosen similarly. Directions of arrangement of the first terminals of the row and column side drive circuits are chosen in a manner similar to the directions of the row and column terminals of the display section, respectively. Such an arrangement of the first terminals as described above is made possible because the row and column side drive circuits are formed on insulating substrates which are made of non-single crystal material and are different from the insulating substrate described above, thereby making the two drive circuits in larger sizes. Installing the terminals in such an arrangement makes it possible to easily install the conducting layers connected to the shorting line, similarly to that described previously.

It is preferable that the conducting layers and the shorting line as described above be installed. The conducting layers are installed so as not to cross each other.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
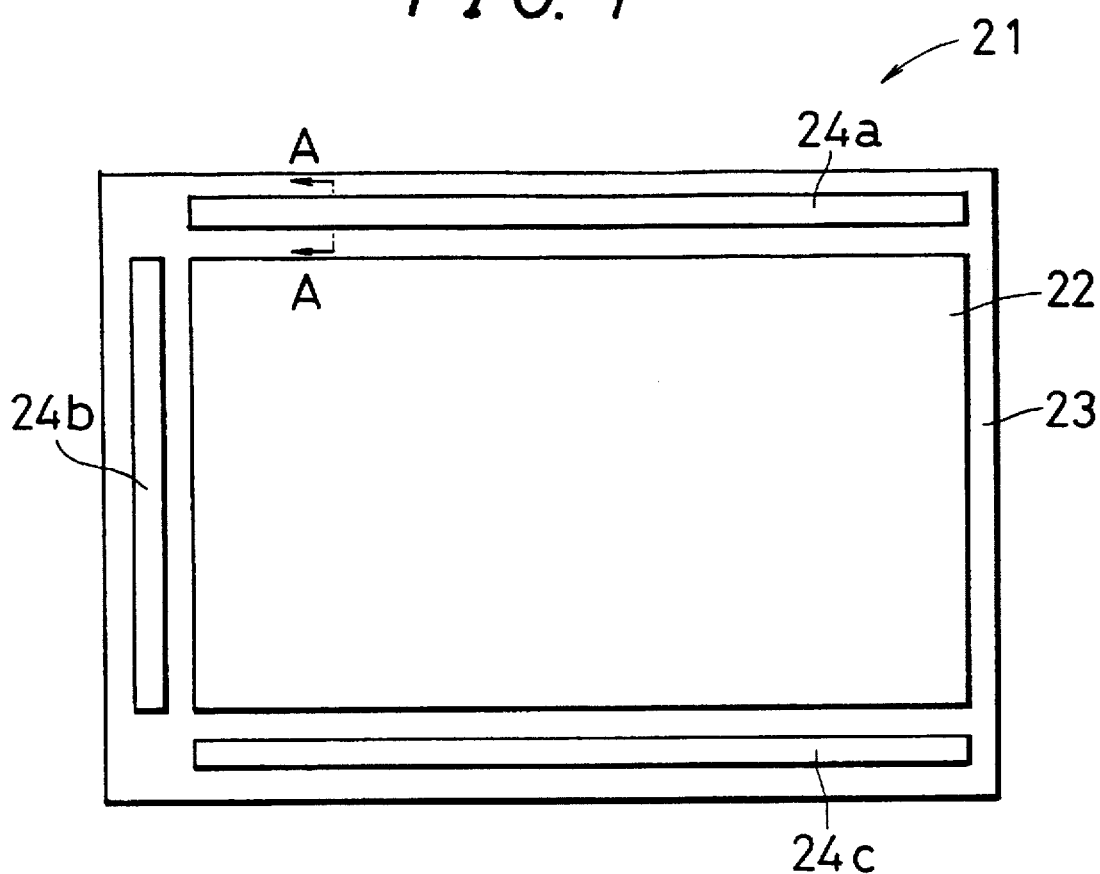
FIG. 1 is a plan view of a display apparatus 21 according to an embodiment of the invention.

Now referring to the drawings, preferred embodiments of the invention are described below.

Figure 2:
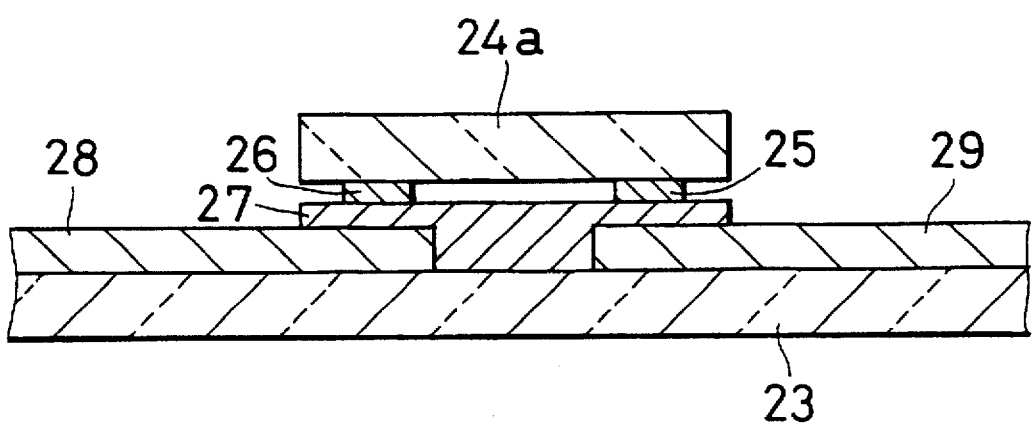
FIG. 2 is a sectional view illustrative of peripheral circuits of the display apparatus 21 as indicated by cut-off line A—A.

FIG. 1 is a plan view of a display apparatus 21 according to an embodiment of the invention. FIG. 2 is a sectional view illustrative of a section of peripheral circuits of the display apparatus 21 as indicated by cut-off line A—A in FIG. 1. As shown in FIG. 1, the display apparatus 21 is made by forming a display section 22 in a rectangular configuration arranged on a rectangular substrate 23 along the periphery thereof. Data lines, not shown in the drawing, of the display section 22, which are arranged in parallel to each other, are extended alternately above and below the display section 22, namely upward and downward directions in FIG. 1, and are electrically connected by means of an anisotropic conductor film 27 or the like to peripheral circuits such as drive circuits formed on substrates 24a, 24c different from the substrate 23. Also scan lines of the display section 22 which are arranged at right angles to the data lines are extended to one edge of the display section 22, and are connected to peripheral circuits such as drive circuits formed on a substrate 24b different from the substrate 23. The substrates 24a through 24c are installed so that the longitudinal directions of the substrates 24a through 24c can be parallel to the periphery of the substrate 22 as well as to the periphery of the substrate 23.

As shown in FIG. 2, constructed circuits such as drive circuits are constructed by means of TFT (thin film transistor) or the like formed on the insulating substrate 24a made of a non-single crystal material such as glass or synthetic resin. Along the periphery of the display section 22, data lines 28 are lead out onto the substrate thereby forming input terminals.

On one end face side of the substrate 23, namely on the right-hand side of FIG. 2, signal lines 29 and output terminals thereof are installed so as to supply serial signals of image information to the drive circuit from an external circuit not shown in the drawing. In the drive circuit formed on the non-single crystal insulating substrate 24a, as described previously, the input terminal 25 is connected to the signal line 29 via the anisotropic conductor film 27. Also in the drive circuit, the output terminal 26 is connected to the data line 28 via the anisotropic conductor film 27. Thus the image information as serial signals which is input from the external circuit to the drive circuit is converted to parallel signals in the drive circuit and output to the data lines 28. The same applies also to the scan lines.

Figure 3A:
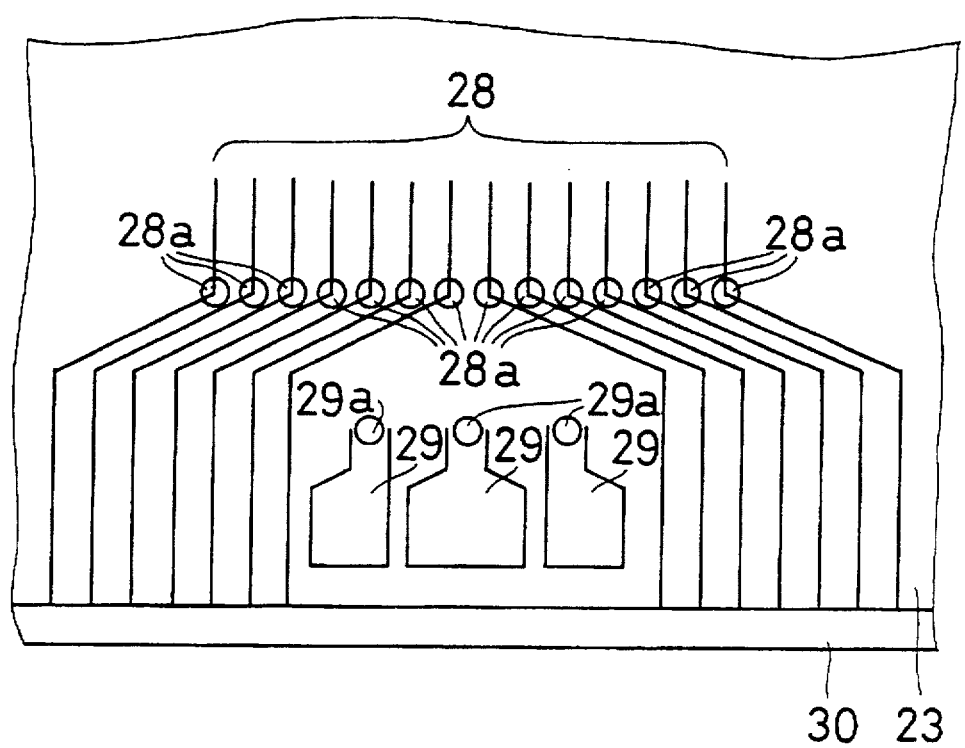
FIGS. 3A, 3B are plan views illustrative of the constitution of a substrate 23 and how the peripheral circuits shown in FIG. 2 are arranged or the substrate 23.
Figure 3B:
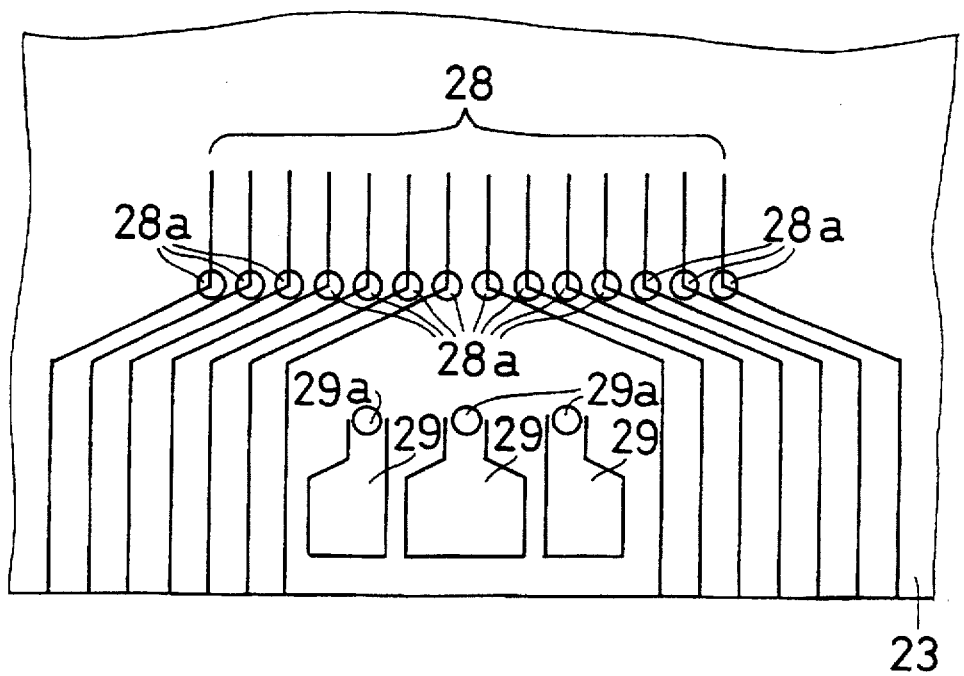

FIGS. 3A, 3B are plan views illustrative of the constitution on the substrate 23 of the peripheral circuit connecting section shown in FIG. 2. As shown in FIG. 3A, 3B, the data lines 28 which are lead out on the substrate 23 are extended in a direction perpendicular to the edge of the substrate 23 where the lines are lead out, and are provided with through-holes 28a for the connection of the output terminals 26 of the drive circuit and the data lines 28. The image information from the drive circuit input to the data lines 28. The output terminals of the signal lines 29 from the external circuit are provided with through-holes 29a for the connection of the signal lines 29 and the input terminals 25 of the drive circuit. The data lines 28 are further extended toward the edge of the substrate 23 without crossing each other. In this embodiment, because the junction between the data lines 28 and the drive circuit and the junction between the signal lines 29 and the drive circuit are arranged parallel to the longitudinal directions of the substrates 24a through 24c where the peripheral circuits such as the drive circuits are formed, as shown in FIGS. 3A, 3B, the data lines 28 can be connected to the short ring 30 formed at an end of the substrate 23 without crossing each other. This constitution makes it possible to short-circuit the static electricity, which is charged in the data lines 28 on the substrate 23 of the display section 22, via the short ring 30, thereby preventing display failures due to insulation breakdown and orientation failure caused by the static electricity of the display section 22.

The substrate 23 shown in FIGS. 3A, 3B is fabricated as described below. The substrate 23 is provided with patterns of the data lines 28, the signal lines 29 and the short ring 30 being formed thereon simultaneously, and a pattern of the scan lines is also formed while being insulated from the data lines 28. Then, the through-holes 28a, 29a are formed. In the portion which is intended to become the display section 22, a liquid crystal display panel and the like are formed. The short ring 30 may exist at the time of mounting the substrates 24a through 24c with the peripheral circuits such as the drive circuits having been formed thereon as shown in FIG. 3A, or may be cut off before mounting as shown in FIG. 3B. In case the short ring 30 exists at the time of mounting, the short ring 30 is cut off after mounting.

Figure 4A:
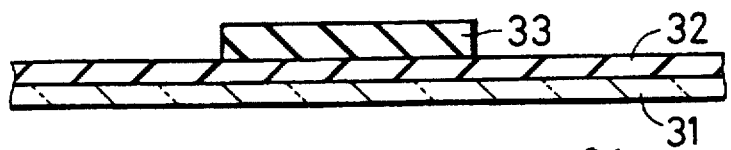
FIGS. 4A through 4G are sectional views illustrative of processes where the peripheral circuits are formed.

FIGS. 4A through 4G are sectional views illustrative of the process of forming the peripheral circuits. As shown in FIG. 4A, an insulating film 32 having a thickness of 1000 angstrom made of $SiO_2$ is formed by, for example, the plasma CVD method (plasma vapor-phase growing method) at a substrate temperature of 300° C. on a transparent glass substrate 31 which is a non-single crystal insulating substrate and has been cleaned beforehand. This makes it possible to prevent the constituent members formed by lamination on the insulator film 32 from being contaminated by alkali ions which may diffuse from the glass substrate 31. Then, an amorphous silicon film 33 with the film thickness of about 1500 angstrom is formed by, for example, the reduced-pressure CVD method at a substrate temperature of 550° C. on the insulator film 32 by laminating over the entire surface thereof. The amorphous silicon film 33 is formed in a pattern of islands which become a source region, drain region and activation region of the thin film silicon to be described later, by a known method such as etching.

Figure 4B:
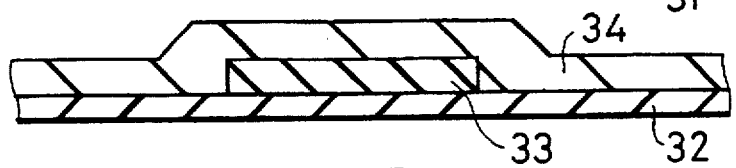

Further, as shown in FIG. 4B, a gate insulating film 34 made of $SiO_2$ which has a thickness of about 1000 angstrom is formed by, for example, the plasma CVD method at a substrate temperature of 300° C. by laminating over the entire surface of the island pattern made of the amorphous silicon film 33.

Figure 4C:
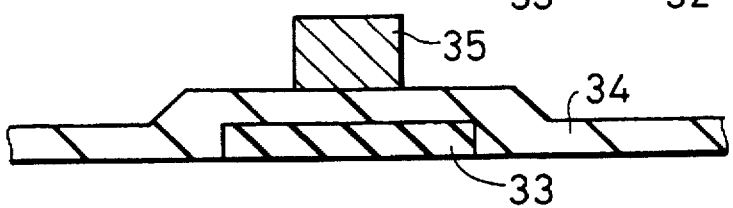

Then, a low-resistance thin metal film about 3000 angstrom-thick made of Ti is formed by laminating over the entire surface of the gate insulating film 34 by, for example, sputtering. Further, the low-resistance thin metal film is formed in a pattern of gate electrode 35 as shown in FIG. 4C by a known method such as etching.

Figure 4D:
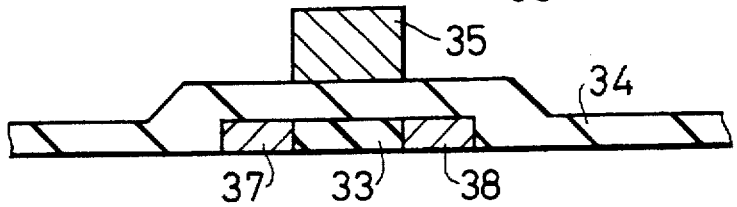

Then, the amorphous silicon film 33 formed in the pattern of island as shown in FIG. 4D is doped with an impurity, for example phosphor, through the gate insulating film 34 with an acceleration voltage 80 keV and density $5 \times 10^{15}$ $cm^{-2}$. Thus, the source region 37 and the drain region 38 are formed. This is followed by heat treatment as required to activate the impurity injected into the source region 37 and the drain region 38.

Figure 4E:
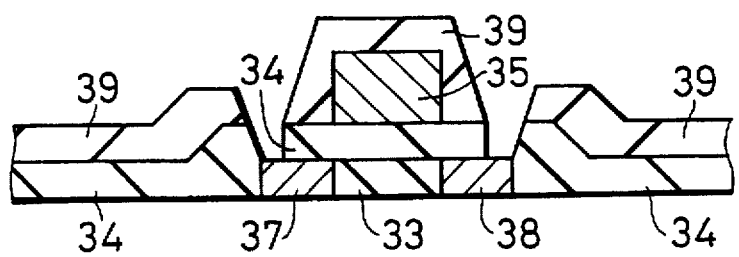

Then, a $SiO_2$ film with the film thickness of about 4000 angstrom is formed as an interposing layer insulator film 39 by, for example, the APCVD method (normal pressure CVD method) at a substrate temperature of 300° C. on the gate electrode 35 by laminating over the entire surface thereof. This is followed by the removal of specified portions of the interposing layer insulator film 39 and the gate insulating film 34 by a known method such as etching as shown in FIG. 4E, thereby forming contact holes communicating with the source region 37 and the drain region 38.

Figure 4F:
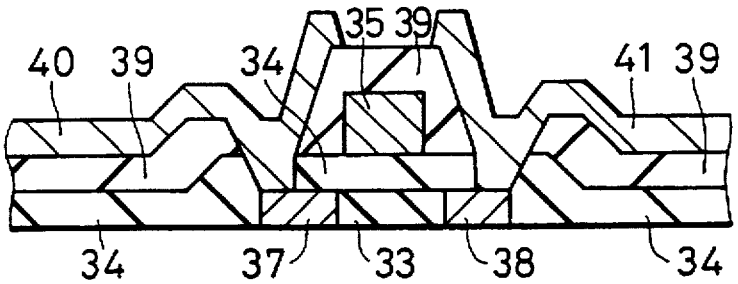
Figure 4G:
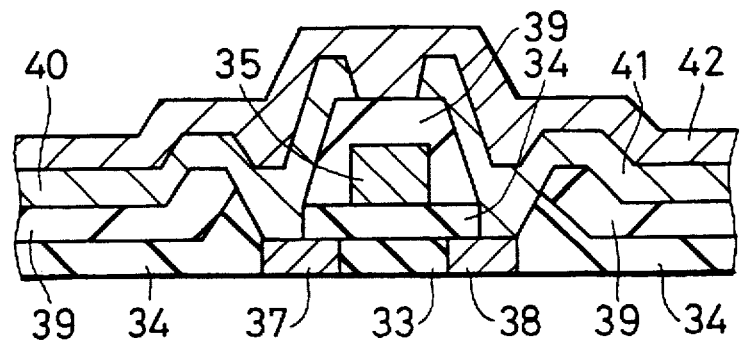
Figure 5:
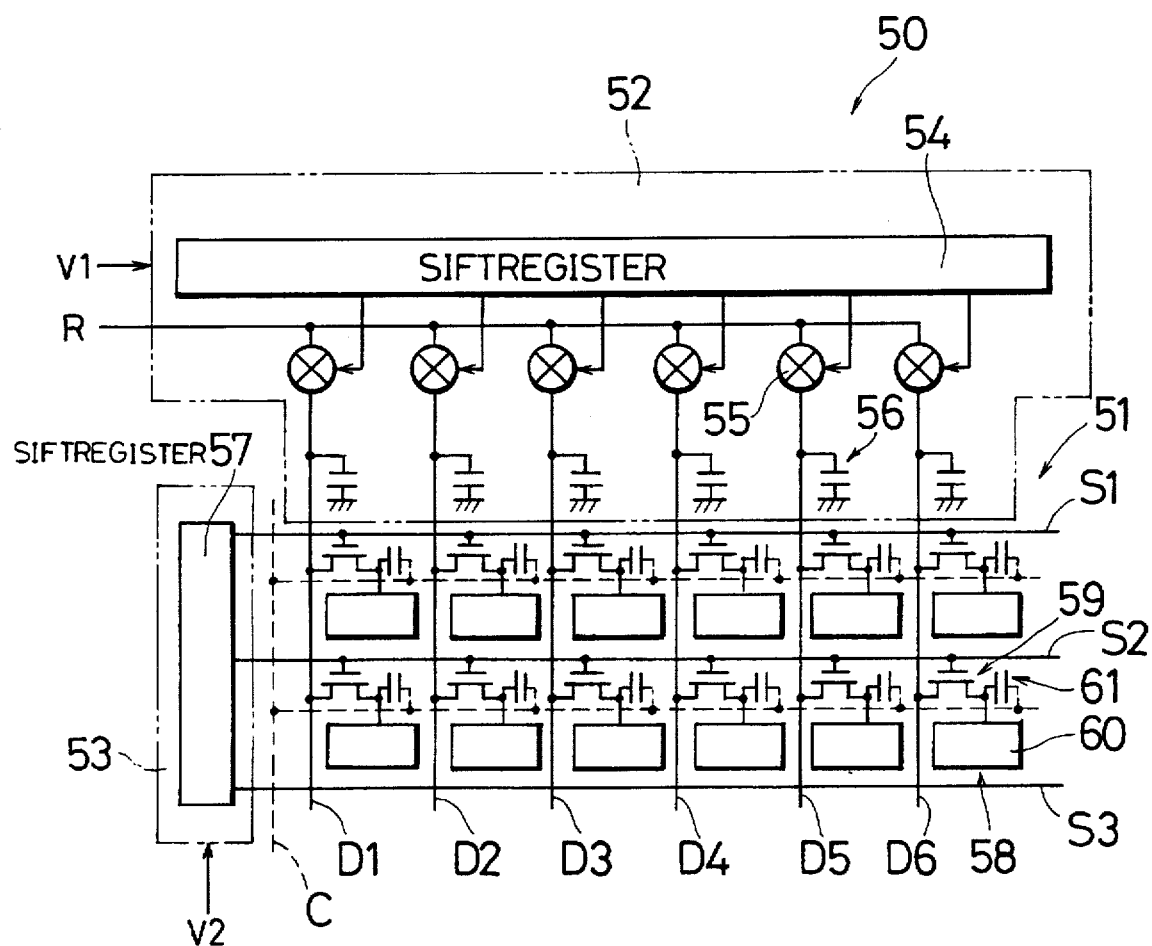
FIG. 5 is a view illustrative of an example of equivalent circuit of a display apparatus 50.
Figure 6A:
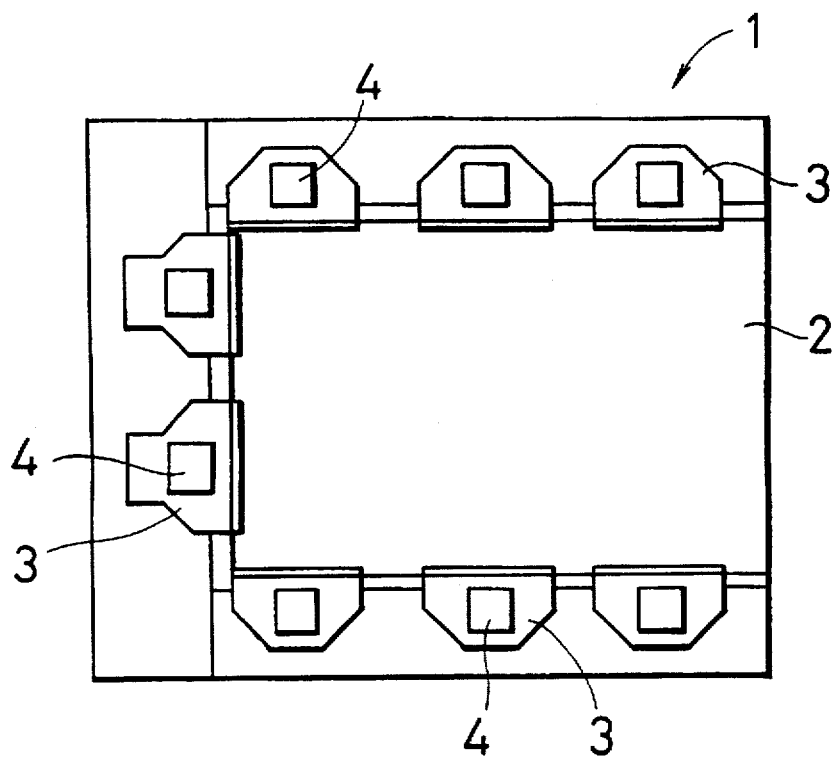
FIGS. 6A, 6B are plan views illustrative of the connection of the drive circuits and a display panel in a display apparatus of the prior aft.
Figure 6B:
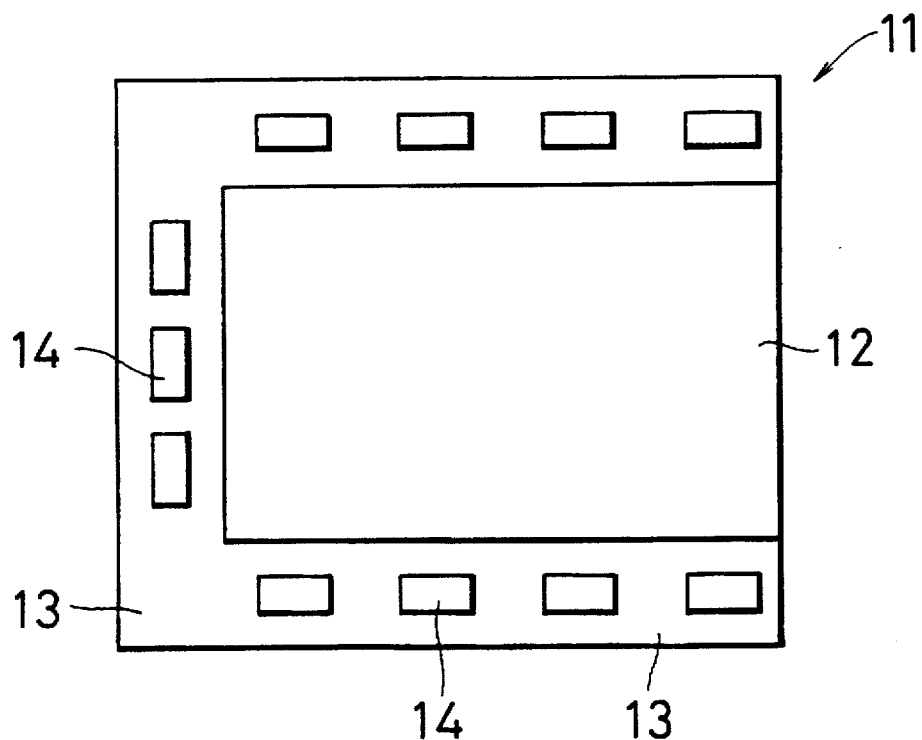
Figure 7:
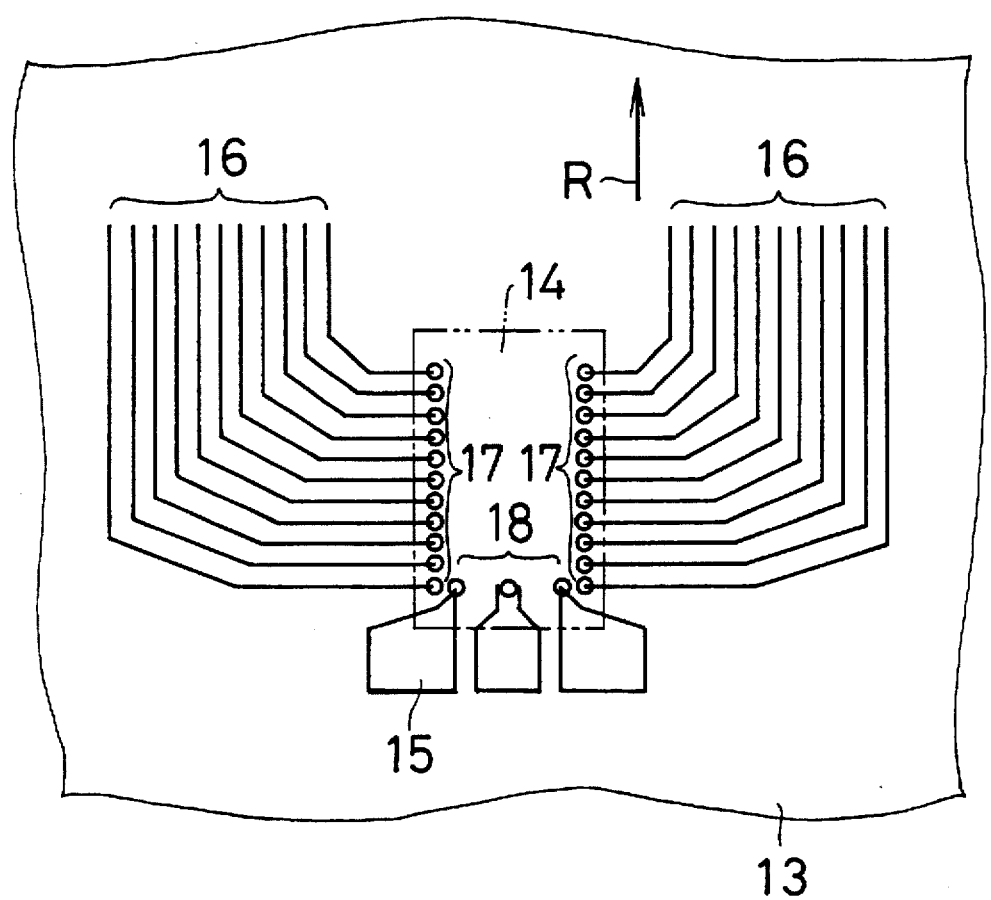
FIG. 7 is a plan view illustrative of the connection the TFT drive circuit 14 and the scan lines 16 or the data lines 16 formed by the COG method shown in FIG. 6B.

Then as shown in FIG. 4F, an Al film is formed by laminating over the entire surface of the interposing layer insulator film 39 by sputtering. This is followed by the etching of the Al film to form the Al film of a specified pattern, thereby forming a source electrode 40 and a drain electrode 41.

Further, a protective film 42 made of SiNx is formed by laminating over the entire surface of the source electrode 40 and the drain electrode 41. The protective film 42 is provided with a pad section which is a through hole by making a pattern of a specified configuration.

A plurality of TFTs are formed simultaneously on the glass substrate 31 as described above. The glass substrate 31 provided with the peripheral circuits formed thereon as described above is cut off into predetermined shape, and is connected via the anisotropic conductor film 27 onto the substrates 23 where the connecting circuit is formed as shown in FIGS. 3A,B, as the substrates 24a through 24c. Length of the longitudinal direction of any one substrate 24a to 24c is set to 5 to 6 cm when the diagonal size of the display section 22 is 5 to 6 inches, or to 10 to 15 cm when the diagonal size of the display section 22 is 8.4 to 10 inches.

According to this embodiment as described above, peripheral circuits including a plurality of drive circuits and wiring strips are formed on the non-single crystal insulating substrate 31. For example, one drive circuit formed on one sheet of the non-single crystal insulating substrate 31 corresponds to four to ten equivalents of drive circuits mounted on a substrate by using the previously known COG method, which substrate constitutes a display panel. Unlike in the prior art where a plurality of relatively small drive circuits are mounted on a substrate, the non-single crystal insulating substrates 24a–24c having a plurality of drive circuits formed thereon are connected to the substrate 23 in the present invention. The output terminals 26 of the drive circuits and the input terminals of the data lines 28 connected thereto can be arranged in line, making it possible to arrange the output terminals of the signal lines 29 parallel to the direction of arrangement of the input terminals on the substrate 23. Therefore, the data lines 28 can be easily connected to the short ring 30 provided at an end of the substrate 23 without crossing each other, thereby making it possible to prevent display failures of the display apparatus 21 due to charging of static electricity in the process of manufacturing the display apparatus 21.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A display apparatus comprising:
    a display panel having a plurality of pixels arranged in a matrix on an insulating substrate, a plurality of row and column wiring strips, with row and column wiring strip intersections corresponding to pixels, and a plurality of row and column terminals connected to corresponding ones of the row and column wiring strips, the row and column terminals receiving input display signals to selectively drive the pixels;

drive circuits having a plurality of output terminals installed on the periphery of the insulating substrate and connected individually to corresponding ones of the row and column terminals, the drive circuits outputting the display signals from the output terminals at a specified timing;

a plurality of conductors connected to the plurality of row and column terminals and mounted on the insulating substrate, each conductor being directed both towards the periphery of the insulating substrate and towards the display panels such that said conductors do not intersect; and a shorting line installed along the periphery of the insulating substrate connecting the conductors collectively, wherein said drive circuits are formed on another substrate placed on top of the insulating substrate that overlaps the row and column terminals of the display panel so that the row and column terminals are electrically connected by an electrically conductive film with the corresponding output terminals of the drive circuits, a direction of arrangement of the row terminals of the display panel crosses lines of pixels connected to the row terminals and a direction of arrangement of the column terminals of the display section crosses lines of pixels connected to the column terminals, and a direction of arrangement of the output terminals of the row and column drive circuits is parallel to the row and column terminals of the display panel, respectively.

2. The display apparatus as claimed in claim 1, wherein the conductors include row and column conductors connected to corresponding row and column terminals which extend to the substrate periphery and connect to the shorting line.

3. The display apparatus in claim 1, wherein the electrically conductive film is an anisotropic conductive resin.

4. A display apparatus comprising:
    a first insulating substrate;
    a display section having a plurality of pixels formed on the first insulating substrate and arranged in a matrix, a plurality of row and column wiring strips, with row and column wiring strip intersections corresponding to pixels, and a plurality of row and column terminals connected to the row and column wiring strips, respectively, the row and column terminals receiving the input of display signals to selectively drive the pixels;

a plurality of output terminals formed on the first insulating substrate to output display signals which are supplied from an external circuit;

a plurality of conductors connected to the plurality of row and column terminals and mounted on the insulating substrate, each conductor being directed both towards the periphery of the insulating substrate and towards the display panel such that said conductors do not intersect;

thin film row and column drive circuits having a plurality of first and second terminals connected individually to corresponding ones of the row or column terminals and the output terminals, the drive circuits outputting the display signals from the second terminals to the row and column terminals which are input to the second terminals from the first terminals from the output terminals at a specified timing; and a shorting line installed along the periphery of the insulating substrate connecting the conductors collectively, wherein the thin film row and column drive circuits are formed on a second insulating substrate made of a non-single crystal material which is different from a material which forms the first insulting substrate, and are arranged along the perimeter of the display section on the first insulating substrate;

a direction of arrangement of the row terminals of the display panel is perpendicular to the pixels connected to the row terminals and a direction of arrangement of the column terminals is perpendicular to the lines of pixels connected to the column terminals, and a direction of arrangement of the first terminals of the row and column drive circuits is parallel to the row and column terminals of the display section, respectively.

5. The display apparatus as claimed in claim 4, wherein the conductors include row and column conductors connected to corresponding row and column terminals which extend to the substrate periphery and connect to the shorting line.

6. The display apparatus in claim 4, herein the another insulating substrate is formed on top of the insulating substrate and overlaps the display section row or column terminals to permit direct connection with the corresponding thin film drive circuit output terminals.

7. The display apparatus in claim 6, wherein the electrically conductive film is an anisotropic conductive resin.

8. A display apparatus comprising:

an insulated substrate;

a liquid crystal display (LCD) panel formed on the insulated substrate;

a plurality of separate LCD driver circuits connected to the LCD panel, each driver circuit being formed on a glass substrate located on the insulated substrate between an edge of the LCD panel and an outer edge of the insulated substrate and parallel to the LCD panel edge and the outer insulated substrate edge, each driver circuit receiving input signals applied to plural input terminals on one side of the driver circuit and providing output signals to the LCD panel at output terminals on an opposite side of the driver circuit by way of signal lines connected to corresponding ones of the output terminals, and each driver circuit overlapping the LCD panel output terminals to connect the LCD panel and the driver circuit through an electrically conductive film; and an electrical conductor formed on the outer edge of the insulated substrate, wherein the signal lines extend perpendicular to the LCD panel edge and to the outer edge of the insulated substrate and electrically connect with the electrical conductor.

9. The display apparatus in claim 8, further comprising:

a first set of through-holes arranged in a first line parallel to the opposite side of the driver permitting electrical connection of the output terminals to the signal lines; and a second set of through-holes arranged in a second line parallel to the one side of the driver permitting electrical connection of the input terminals to the input signals, wherein the first and second lines are perpendicular to the signal lines.

10. The display apparatus in claim 8, wherein each driver circuit is formed on a thin film.

11. The display apparatus of claim 8, wherein the electrically conductive film is an anisotropic conductive resin.

* * * * *